United States Patent [19]

Friel

[11] 4,127,436
[45] Nov. 28, 1978

[54] VACUUM LAMINATING PROCESS

[75] Inventor: Daniel D. Friel, Greenville, Del.

[73] Assignee: E. I. Du Pont de Nemours and Company, Wilmington, Del.

[21] Appl. No.: 767,062

[22] Filed: Feb. 9, 1977

Related U.S. Application Data

[60] Division of Ser. No. 568,904, Apr. 17, 1975, abandoned, which is a continuation-in-part of Ser. No. 513,112, Oct. 8, 1974, abandoned.

[51] Int. Cl.² ............................................. C23F 1/02
[52] U.S. Cl. .................................... 156/630; 96/35.1; 156/235; 156/238; 156/247; 156/285; 156/634; 156/656; 156/659; 156/902; 427/96

[58] Field of Search .............. 96/28, 35.1, 36.2, 38.4, 96/71, 83, 86 P, 115 P; 29/625, 626; 427/96-99, 256, 259; 156/87, 230, 231, 235, 238, 247, 654, 285, 286, 659-661, 902, 656, 212-214, 468, 475, 629-634; 428/901

[56] References Cited

U.S. PATENT DOCUMENTS

| | | | |
|---|---|---|---|
| 3,395,014 | 7/1968 | Cohen et al. | 96/35.1 X |
| 3,629,036 | 12/1971 | Isaacson | 156/241 |

Primary Examiner—William A. Powell

[57] ABSTRACT

A process is described for applying, under vacuum, a photoresist-forming layer to a surface, such as a printed circuit board, whereby a laminate without entrapped air bubbles is obtained. The surface to which the photoresist-forming layer is applied has raised areas, such as circuit lines, which are completely enveloped by the layer.

13 Claims, 2 Drawing Figures

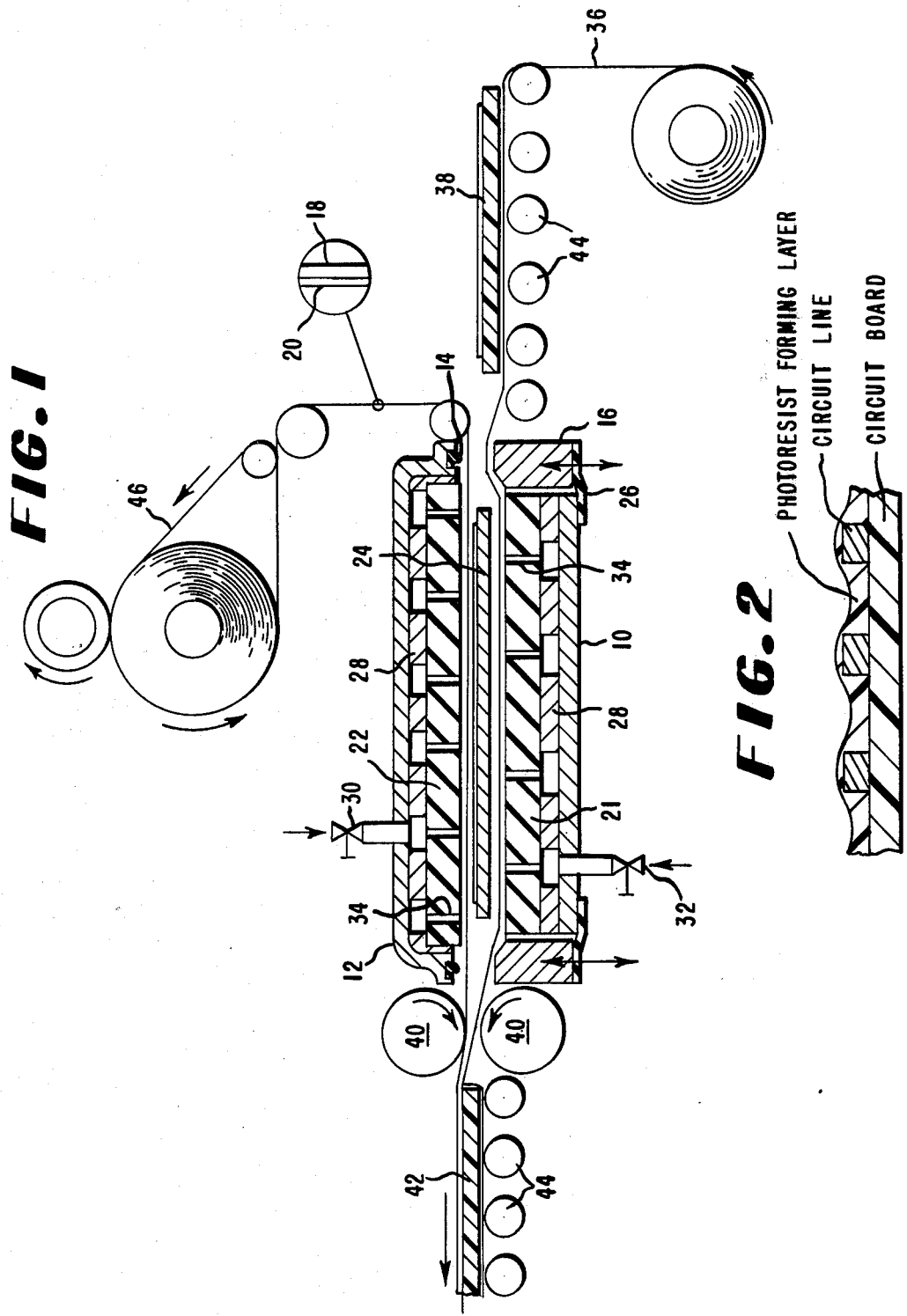

VACUUM LAMINATING PROCESS

CROSS REFERENCE TO RELATED APPLICATIONS

This application is a divisional of U.S. application Ser. No. 568,904, filed Apr. 17, 1975, now abandoned, which is a continuation-in-part of U.S. application Ser. No. 513,112, filed Oct. 8, 1974, now abandoned.

BACKGROUND OF THE INVENTION

The invention relates to the field of applying dry film photoresist-forming layers to surfaces, for example circuit boards and the like, for use in processes such as those described in U.S. Pat. Nos. 3,469,982 and 3,526,504, where, however, the surface to which the layer is applied has raised areas. A preferred process of the invention is more particularly related to forming a photoresist on a circuit board with raised circuit lines, which are usually formed by practicing the processes of the above-cited patents, as a "soldermask" for the purpose of controlling application of solder to said circuit lines and electrical components in contact therewith. The process of the invention is also useful for applying photoresist-forming layers to nonplanar surfaces.

In conventional processes for modifying surfaces using a photoresist, the photoresist-forming layer is applied to the surface with heated pressure rolls or other such mechanical members which apply pressure to one area of the layer at a time. Where the surface has raised areas, however, a problem of air entrapment at the edges of the raised areas often occurs, which can be exacerbated by a subsequent high temperature treatment, e.g., contact with a bath of molten solder, which may cause the entrapped air bubbles to expand. In addition, the photoresist-forming layer must be pressed against the surface with substantial pressure without fracturing the portions of the layer on top of the raised areas.

It has been discovered according to the invention that if the photoresist-forming layer is applied to the surface in an evacuated environment and pressure is applied to the entire area of the layer at once instead of progressively as is the case in passing through pressure rolls, to provide the necessary force for application of the layer to the surface, a laminate without entrapped air bubbles or fractured areas can be obtained, even in the case where the thickness of the photoresist-forming layer is less than the height of the raised areas of the surface. The photoresist-forming layer is usually exposed imagewise to actinic radiation after being applied to the surface. It is then developed leaving a resist image on the surface which protects the surface and raised areas under the resist image.

Suitable vacuum packaging techniques and devices which can be adapted to laminate the photoresist-forming layer to the surface are well known in the prior art, as are photohardenable and other materials useful as the photoresist-forming layer.

SUMMARY OF THE INVENTION

The invention is a process of applying a photoresist-forming layer to a surface having raised areas, comprising:

(1) positioning the surface of a solid, unexposed, photoresist-forming layer adjacent to a surface having raised areas, while the other surface of the layer has adhered thereto with low-to-moderate adherence a thin, flexible, polymeric film support, (2) reducing the absolute gas pressure to less than one atmosphere in the region between the surface having raised areas and the surface of the layer, and (3) applying pressure to the entire surface of the film support at once over the area of the layer adjacent to the surface having raised areas, whereby the photoresist-forming layer is forced into intimate contact with the surface having raised areas.

The invention also provides a process for forming a photoresist on a surface having raised areas comprising, in addition to the steps above, in either order of steps (4) and (5):

(4) exposing the layer, imagewise, to actinic radiation, (5) stripping the film support from the resulting image-bearing layer, and (6) removing areas of the layer imagewise to form a resist image on the surface having raised areas.

The invention further provides a process having the additional step of permanently modifying the adjacent areas on said surface which are unprotected by the resist image by treating with a reagent capable of etching said areas or depositing a material on said areas.

The photoresist-forming layer, conventionally referred to as "dry film resist," is a layer of photosensitive material from which a resist image may be produced after imagewise exposure to actinic radiation by removal of areas of the layer. In the case of a negative-working material, the unexposed areas are removed and the exposed areas remain as the resist image. In the case of positive-working materials, the unexposed areas form the resist image. These materials of which the photoresist-forming layer is formed are much weaker than the film support on which they are coated and when applied at elevated temperatures become very soft and tacky. The two-layer structure of the film support and photoresist-forming layer is therefore required for application of the photoresist-forming layer using a vacuum lamination technique. The film support enables the photoresist-forming layer to be held apart from the surface having raised areas, if desired, and acts as a pressure-transmitting member to force the soft, tacky layer into conformation with the raised areas.

BRIEF DESCRIPTION OF DRAWINGS

FIG. 1 is a drawing of a vacuum laminator apparatus of a type suitable for applying a photoresist-forming layer according to the invention. The disposition of the surface having raised areas and the photoresist inside the apparatus is illustrated.

FIG. 2 is a cross-section of a photoresist-forming layer applied according to the invention to a circuit board with circuit lines having a height greater than the thickness of the layer.

DESCRIPTION OF THE PREFERRED EMBODIMENTS

The processes of the invention are a method of applying a photoresist-forming layer to a surface having raised areas and the processes of forming a photoresist on that surface and of permanently modifying the surface in an image pattern by etching or deposition of material. Useful materials for practice of the invention are described in U.S. Pat. Nos. 3,469,982 and 3,526,504. The photoresist-forming layer may be a negative-working photohardenable layer or a positive-working photosoluble or photodesensitizable layer.

Photohardenable materials are those which become hardened when exposed to actinic radiation and are preferably selected from photopolymerizable, photocrosslinkable and photodimerizable materials. Such materials are usually characterized by having ethylenically unsaturated or benzophenone-type groups and are described in U.S. Pat. Nos. 2,760,863; 3,418,295; 3,649,268; 3,607,264; 3,622,334; and French Pat. No. 7211658, for example. Particularly preferred are photopolymerizable materials comprising an addition-polymerizable, ethylenically unsaturated compound ("monomer"), a macromolecular organic polymer binder, and a polymerization initiator activatable by actinic radiation. In the above patents there are disclosed various suitable ethylenically unsaturated compounds, thermoplastic polymeric binders, addition polymerization initiators activatable by actinic light and other constituents. Other suitable ethylenically unsaturated monomers are those disclosed in U.S. Pat. Nos. 3,060,023; 3,261,686; and 3,380,831. In the case of the polymerizable polymers, no binder is necessary although a small amount may be used. In addition to polymerization initiators, other ingredients such as plasticizers, thermal inhibitors, colorants, fillers, etc., also may be present as is well known in the art. As taught by the above references, some of the ingredients can act in a dual role. For example, in the monomer-binder systems, the ethylenically unsaturated photopolymerizable monomer can also act as a plasticizer for the thermoplastic binder.

Suitable binders which can be used as the sole binder or in combination with others include the following: polyacrylate and alpha-alkyl polyacrylate esters, e.g., polymethyl methacylate and polyethyl methacrylate; nylons or polyamides, e.g., N-methoxymethyl polyhexamethylene adipamide; vinylidene chloride copolymers, e.g., vinylidene chloride/acrylonitrile; vinylidene chloride/methacrylate and vinylidene chloride/vinyl acetate copolymers; ethylene/vinyl acetate copolymers; cellulose ethers, e.g., methyl cellulose, ethyl cellulose and benzyl cellulose; synthetic rubber, e.g., butadiene/acrylonitrile, acrylonitrile/butadiene/styrene, methacrylate/ acrylonitrile/butadiene/styrene copolymers, 2-chlorobutadiene-1,3-polymers, chlorinated rubber, and styrene/butadiene/styrene, styrene/isoprene/styrene block copolymers; cellulose esters, e.g., cellulose acetate, cellulose acetate succinate and cellulose butyrate; polyvinyl esters, e.g., polyvinyl acetate/acrylate, polyvinyl acetate/methacrylate and polyvinyl acetate; copolyesters, e.g., those prepared from the reaction product of a polymethylene glycol of the formula $HO(CH_2)_nOH$, wherein $n = 2$ to 10, and (1) hexahydroterephthalic, sebacic and terephthalic acids, (2) therephthalic, isophthalic and sebacic acids, (3) terephthalic and sebacic acids, (4) terephthalic and isophthalic acids, and (5) mixtures of copolyesters prepared from said glycol and (i) terephthalic, isophthalic and sebacic acids and (ii) terephthalic, isophthalic, sebacic and adipic acids; high molecular weight polyethylene oxides of polyglycols having average molecular weights from about 4,000 to 1,000,000; polyvinyl chloride and copolymers, e.g., polyvinyl chloride/acetate; polyvinyl acetal, e.g., polyvinyl butyral, polyvinyl formal; polyformaldehydes; saturated and unsaturated polyurethanes; polycarbonates; polystyrenes; and epoxides, e.g., expoxides end-capped with acrylates.

Suitable monomers which can be used as the sole monomer or in combination with others include the following: t-butyl acrylate; 1,5-pentanediol diacrylate; N,N-diethylaminoethyl acrylate; ethylene glycol diacrylate; 1,4-butanediol diacrylate; diethylene glycol diacrylate; hexamethylene glycol diacrylate; 1,3-propanediol diacrylate; decamethylene glycol diacrylate; 1,4-cyclohexanediol diacrylate; 2,2-dimethylolpropane diacrylate; glycerol diacrylate; tripropylene glycol diacrylate; glycerol triacrylate; trimethylol propane triacrylate; pentaerythritol triacrylate; 2,2-di(p-hydroxyphenyl)-propane diacrylate; pentaerythritol tetraacrylate; 2,2-di(p-hydroxyphenyl)-propane dimethacrylate; triethylene glycol diacrylate; polyoxyethyl-2,2-di(p-hydroxyphenyl)-propane dimethacrylate; triethylene glycol dimethacrylate; polyoxypropyltrimethylol propane triacrylate (m.w. 462); ethylene glycol dimethacrylate; butylene glycol dimethacrylate; 1,3-propanediol dimethacrylate; 1,2,4-butanetriol trimethacrylate; 2,2,4-trimethyl-1,3-pentanediol dimethacrylate; pentaerythritol trimethacrylate; 1-phenylethylene-1,2-dimethacrylate; pentaerythritol tetramethacrylate; trimethylol propane trimethacrylate; 1,5-pentanediol dimethacrylate; diallyl fumarate; styrene; 1,4-benzenediol dimethacrylate; 1,4-diisopropenyl benzene; and 1,3,5-triisopropenyl benzene.

In addition to the ethylenically unsaturated monomers mentioned above, the following free-radical initiated, chain-propagating, addition-polymerizable, ethylenically unsaturated compounds having a molecular weight of at least 300 can be used with the above-described binders: an alkylene or a polyalkylene glycol diacrylate prepared from an alkylene glycol of 2 to 15 carbons or a polyalkylene ether glycol of 1 to 10 ether linkages; and monomers disclosed in U.S. Pat. No. 2,927,022, e.g., those having a plurality of addition-polymerizable ethylenic linkages, particularly when present as terminal linkages, and especially those wherein at least one and preferably most of such linkages are conjugated with a double bonded carbon, including carbon doubly bonded to carbon and to such heteroatoms as nitrogen, oxygen and sulfur. Outstanding are such materials wherein the ethylenically unsaturated groups, especially vinylidene groups, are conjugated with ester or amide structures.

A preferred class of free-radical generating, addition polymerization initiators activatable by actinic radiation and thermally inactive at and below 185° C. is the substituted and unsubstituted polynuclear quinones which are compounds having two intracyclic carbonyl groups attached to intracyclic carbon atoms in a conjugated carbocyclic ring system. Suitable such initiators include 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloroanaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz(α)anthracene-7,12-dione. Other polymerization initiators which are also useful, even through some may be thermally active at temperatures as low as 85° C., are described in U.S. Pat. No. 2,760,863 and include vicinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc.; α-hydrocarbon substituted aromatic acyloins, including α-methyl benzoin, α-allylbenzoin and α-phenylbenzoin. In addition the photoreducible dyes and reducing agents disclosed in U.S. Pat. Nos. 2,850,445; 3,097,096; 3,074,974; 3,097,097; and 3,145,104 as well as dyes of the phenazine, oxazine, and quinone classes may be used. Other suitable polymerization initiators include Michler's ketone, benzophenone, 2,4,5-triphenylimidazolyl dimers with hydrogen donors, and mixtures thereof, as described, for example, in U.S. Pat. Nos. 3,427,161; 3,479,185; and 3,549,367.

Suitable thermal polymerization inhibitors that can be used in photopolymerizable compositions include p-methoxyphenol, hydroquinone, and alkyl and aryl-substituted hydroquinones and quinones, tert-butyl catechol, pyrogallol, copper resinate, napthylamines, beatnaphthol, cuprous chloride, 2,6-di-tert-butyl p-cresol, phenothiazine, pyridine, nitrobenzene and dinitrobenzene. Other useful inhibitors include p-toluquinone and chloranil.

Photosoluble and photodensensitizable materials are those which are solubilized or decomposed, rather than polymerized, in areas exposed to light. When the latter are removed, the unexposed areas remain on the surface as a durable positive resist. Such materials are disclosed in U.S. Pat. Nos. 3,779,778 and 3,782,939 and U.S. patent application Ser. No. 833,756 of Roos, and Ser. No. 308,856 of Cohen and Heiart, filed June 16, 1969. Preferred materials are (a) flexible, photosoluble, thermoplastic macromolecular organic polymers having recurring pendent o-quinone diazide groups chemically bonded to the polymers and being substantially free of groups which will react with the photoreaction products of said o-quinone diazide groups and (b) photodesensitizable mixtures of photosensitive bis-diazonium salts and thermoplastic macromolecular organic colloids.

The photoresist-forming layer is thermoplastic and is preferably laminated at an elevated temperature at or above the stick temperature of the layer, which is the lowest temperature at which the layer will form a firm bond with and conform to the surface having raised areas. Commercial photoresist materials usually have a stick temperature in excess of 40° C. With some preferred materials the temperature of the surface employed during lamination is 100° C. or more. The stick temperature of various materials may be lowered (e.g., to or below room temperature) by addition of excess monomer or plasticizer. It is usually desired, however, that the layer become soft and tacky when heated above room temperature. It is preferred to heat the surface having raised areas to provide the elevated temperature for lamination.

These materials may be coated as a layer on a polymeric film support to form a photosensitive resist-forming element. This type of element has conventionally been laminated with pressure rolls or the like to a surface to be modified. When the surface has raised areas, however, small bubbles tend to form at the edges of the raised areas, particularly where there is an angular joint between the surface and the side walls of the raised areas thereon. After development of the resist image and upon use thereof for modification of the unprotected areas of the surface, e.g., by etching, soldering, etc., the material being used to modify the surface, e.g., acid, solder, etc., may get under the resist in the areas where there are bubbles and modify the surface where it is supposed to be protected. In addition, the pressure rolls can fracture the resist between the raised areas and the rolls. There has been found in accordance with the invention a new process for applying photoresist-forming layers to surfaces having raised areas in which the layer is applied to the surface having raised areas under vacuum. The layer is positioned adjacent to the surface. The layer may be in direct contact with the surface or it may be held apart, i.e., substantially out of contact, therefrom while the area therebetween is evacuated. After evacuation, the two are forced into intimate contact. The force for application of the layer to the surface is applied to the entire surface of the film support at once. It may be furnished by any means, including mechanical, but preferably by a gas pressure difference between the side of the layer adjacent to the surface having raised areas and an area on the side of the layer bearing the polymeric film support. The latter area may be bounded by the film support itself or by a resilient member, such as polymeric sheet (e.g., rubber), in contact with the film support. In one embodiment of the process, the pressure is reduced below atmospheric on the side of the layer bearing the film support and on the side adjacent to the surface having raised areas. The area on the film support side is then vented to the atmosphere, increasing the pressure on that side and forcing the photoresist-forming layer into intimate contact with the surface having raised areas, so that the photoresist-forming layer conforms to the raised areas and forms a firm bond with the surface without entrapped gas bubbles. In addition, the preferred process permits application of the layer to nonplanar surfaces with which a roll laminator cannot be used.

The pressure may also be furnished by forcing the surface having raised areas in the direction of the photoresist-forming layer so that the two come in contact, and the flexible film support on the layer, under the force of a resilient opposing member, forces the layer into intimate contact with the surface.

In addition to enabling the application of a protective layer without air entrapment, the invention provides a process whereby the photoresist-forming layer is applied with substantially uniform overall force to an entire surface at once so that the layer is not extruded across the surface, with non-uniformities in the flow due to the raised areas. The flexible film support, under the force of gas pressure directly or from a resilient member, presses the photoresist-forming layer down in conformation with the raised areas on the surface so that a laminate such as that shown in FIG. 2 is obtained, where the raised areas have a height greater than the layer thickness. In the case where a resilient member presses against the adherent film support of the layer, said member should have a resilience such that under the force of application its surface will conform to that of the flexible film support and layer in contact with the surface having raised areas. A rubber sheet is suitable for this purpose.

The thickness of the photoresist-forming layer is preferably from about 0.0003 to about 0.01 inch. The heights of the raised areas of the surfaces frequently encountered are also of this range, but the photoresist-forming layer must conform to the highest areas on the surface. It has been found that photoresist-forming layers having a thickness less than the height of the raised areas can be laminated by the process of the invention, and the layer will conform to the raised areas without the entrapment of bubbles at the edges of the raised areas and without fracturing the resist above the raised areas leaving the areas unprotected. A photoresist-forming layer can, for example, be used on circuit boards having lines of various heights ranging over the thickness of the layer with excellent conformation of the layer to all of the lines. This obviates the need for excessively thick layers or for changing the resist supply roll for printed circuit boards having different line heights. In addition to surfaces such as printed circuit boards having raised areas in the above range, microcircuitry having circuit lines down to about $5 \times 10^{-6}$ inch in height may also be laminated advantageously according to the invention. The process of the invention is particularly useful for applying resist layers to circuit boards, which, as is well known, are usually planar sheets with a plurality of raised circuit lines in a stratum on their surface. Circuit lines generally have a substantially rectilinear cross section (e.g., square, rectangular or trapezoidal) making it difficult to apply a resist without entrapping air bubbles at the base of the circuit lines, unless the process of the invention is used.

The thin, flexible, polymeric film support adhered to one surface of the photoresist-forming layer, which is in any case required for the manufacture, storage and use of the layer, may serve as the element maintaining a gas pressure for lamination and as a flexible pressure member to force the layer into conformation with the raised areas on the surface. In an apparatus having a resilient member for maintaining a gas pressure difference or for providing a pressure member for forcing the photoresist-forming layer into conformation with the surface having raised areas, the film support prevents the layer from sticking to the resilient member or other part of the apparatus. A suitable support film which preferably has a high degree of dimensional stability to temperature changes, may be chosen from a wide variety of films composed of high polymers, e.g., polyamides, polyolefins, polyesters, vinyl polymers, and cellulose esters, preferably having a thickness of from 0.00025 inch to 0.008 inch or more. If exposure is to be made before removing the support film, it must, of course, transmit a substantial fraction of the actinic radiation incident upon it. If the support film is removed prior to exposure, no such restrictions apply. A particularly suitable film is a transparent polyethylene terephthalate film having a thickness of about 0.001 inch. Suitable removable cover films, which are removed prior to practicing the process and which protect the surface of the layer, may be chosen from the same group of high polymer films described above and may have the same wide range of thickness. A cover film of 0.001 inch thick polyethylene is especially suitable. Support and cover films as described above provide good protection to the photopolymerizable resist layer.

The process is preferably practiced by positioning a photoresist-forming layer adjacent to the surface having raised areas and reducing the gas pressure between the layer and surface below atmospheric pressure in a device which is divided into two chambers by a resilient member. The pressure is then increased, e.g., by venting to the atmosphere, on one side of the member, thereby forcing the layer and the surface firmly together. In one embodiment the film support of the photoresist-forming element itself serves as the resilient member. The absolute gas pressure between the layer and surface is preferably reduced to below 0.1 atmosphere.

FIG. 1 illustrates an apparatus for practicing the process of the invention having opposing members 10 and 12 defining two chambers between which the photoresist-forming layer 18 and adherent film support 20 are gripped by a perimeter seal 14 so as to divide the interior of one chamber from another. The lower member 10 and/or frame 16 is raised so that seal 14 opposes frame 16, and the two chambers are divided from each other by photoresist-forming layer 18 and adherent film support 20, the adherent film support being adjacent to the upper platen 22 and the photoresist-forming layer being adjacent to the circuit board 24 in position for lamination. The support and layer may be held apart from the circuit board 24 by pulling a vacuum in the upper chamber so as to hold the support 20 in contact with the upper platen 22. However, with normal circuit line configurations which permit air to flow between the lines to the edge of the board, it is not necessary to hold the layer apart from the board. Flexible seal 26 maintains an air tight seal between frame 16 and lower member 10 so that the lower chamber is air tight. Insulating spacers 28 separate the upper and lower platens 22 and 21 from upper and lower members 12 and 10. The upper and lower chambers are evacuated through ports 30 and 32. Gas at atmospheric pressure or higher is then admitted through port 30, forcing the photoresist-forming layer into intimate contact with the circuit board 24. Holes 34 in the platens and insulating spacers 28 permit the gas pressure or vacuum to be distributed through each chamber. After the photoresist-forming layer has been applied to the circuit board 24, gas is admitted to the lower chamber, the upper and lower members are separated, and the circuit board 24 with the photoresist-forming layer 18 laminated thereto is removed from between the chambers.

In the device illustrated, a web 36 is employed as a backing film on the under side of the circuit board 24. The backing film is not necessary to the process of the invention but may be used where it is desired to package the circuit board or other item to which the photoresist-forming layer is applied. The backing film is this case forms a seal with the layer around the board and may also be used to divide the chambers from one another, instead of the photoresist-forming layer. In the latter case, the gas is admitted through port 32, and the upper platen 22 must be resilient, e.g., rubber, so as to spread the force over the entire surface of the adherent support. The backing film is also used in the illustrated device to transport the circuit board in the ready position 38 through the device. The backing film may be any type of web such as a paper sheet, a polymeric film, or a rigid planar material. In addition, web 36 may be another photoresist-forming layer so that such layers are applied to both i.e., opposite sides of the surface, i.e., circuit board 24 simultaneously. Nip rolls 40 move the laminated board 42 out of the device, after which it may be transported by conveyor rolls 44 for further processing. As the photoresist-forming layer is fed from the supply roll, its cover sheet 46 is stripped off and wound up.

The surface with applied photoresist-forming layer may be exposed and developed, forming a resist image on the surface. Development is the imagewise removal of areas of the layer. In the case of negative-working materials, the unexposed areas are removed, and with positive-working materials the exposed areas are removed. Removal can be by treatment with a solvent for the areas to be removed with the aid of mechanical action such as rubbing, brushing and/or abrading, etc., or by a combination of one or more such steps. Removal can also be by selective adhesion of the exposed or unexposed areas to the film support, which are removed when the support is stripped off, leaving a resist image. The surface may then be treated by any of a variety of methods such as etching or deposition of material as described in U.S. Pat. No. 3,469,982. In a preferred process of the invention, molten metal, especially tin-lead solder, is applied to the surface. The bubble-free protective resist image acts as a "soldermask" which protects the areas covered by the resist image under the high temperature treatment necessary for application of the molten metal.

The invention will now be illustrated by the following examples:

EXAMPLE 1

Printed circuit boards having circuit lines of various thicknesses and spacing are laminated with resist-forming layers of the type comprised of a negative-working, photopolymerizable layer having on one surface a 0.001 inch thick, flexible, polyethylene terephthalate film support which is strippable from the layer. The photopolymerizable layers are of the type described in U.S. Pat. No. 3,469,982, comprised of an addition-polymerizable ethylenically unsaturated acrylic compound, a macromolecular polymeric binder and a polymerization initiator activatable by actinic radiation. The layers also have a 0.001 inch thick strippable polyethylene cover sheet on one surface which is stripped off prior to lamination. The printed circuit boards are heated to over 125° C., and the layers are applied by contacting with the boards under vacuum in a two-chambered vacuum laminating device of the general type illustrated in FIG. 1. The chambers are sealed with the layer positioned adjacent to and apart from the circuit board, and the chambers are evacuated to less than 1 mm. of mercury in 9 seconds. The upper chamber is then vented to the atmosphere creating a difference in the air pressure between the upper chamber which is bounded by the adherent film support and the lower chamber which includes the region between the layer and the circuit board. The layer is thereby forced into intimate contact with and becomes bonded to the circuit board. Good conformation and bonding of various resists to the circuit lines without the entrapment of air bubbles, is obtained with resist and circuit line dimensions as listed below:

| RESIST THICKNESS (inches × $10^{-3}$) | CIRCUIT LINE THICKNESS (inches × $10^{-3}$) | SPACE BETWEEN CIRCUIT LINES (inches × $10^{-3}$) |
| --- | --- | --- |
| 2.0 | 2.0 | 33.3 |
| 2.0 | 2.8 | 33.3 |
| 2.0 | 4.4 | 33.3 |
| 3.0 | 2.8 | 11.6 |
| 4.0 | 4.5 | 11.6 |

The resist thickness, circuit line thickness and space between circuit lines are factors in determining whether a resist can be laminated. The smaller the spacing between circuit lines, the smaller is the thickness of the circuit lines over which a resist of thickness less than the circuit lines, can be laminated with good conformation.

EXAMPLE 2

To compare the use of pressure rolls to the process of the invention, a 0.002 inch thick photoresist-forming layer of the type described in Example 1, comprised of a photopolymerizable material coated on a strippable support, is applied to printed circuit boards.

The side of the photoresist-forming layer opposite from the side bearing the strippable support is placed in contact with a printed circuit board having copper circuit lines 0.0333 inch apart and with a height of 0.0044 inch. The circuit board is preheated to over 100° C. The layer and board are then passed through opposing pressure rolls having a surface temperature of 121° C. The support is then stripped from the layer which remains adhered to the board. Upon inspection of the bond between the layer and board, gross air bubbles are visible around the edges of the circuit lines.

An identical photoresist-forming layer with strippable support is positioned adjacent to a circuit board having circuit lines with the same height and spacing in a vacuum laminating device as in Example 1. The chambers on opposite sides of the photoresist-forming layer are evacuated to 0.7 mm. of mercury. The circuit board is preheated to over 100° C., and the platen supporting it is heated to 121° C. The area on the side of the layer bearing the support is vented to the atmosphere, forcing the resist into intimate contact with the circuit board. The support is stripped from the layer, and there remains a bonded layer of photoresist-forming material adhered to the circuit board and conformed to the circuit lines, without entrapped air bubbles visible.

EXAMPLE 3

This example illustrates the preferred process of the invention for applying molten metal to a surface having raised areas. A photoresist-forming layer with adherent, strippable support is applied to a printed circuit board comprised of an epoxy-fiberglass board with copper circuit lines, by the process of the invention described in Example 1. The laminated board is then removed from the laminator and cooled to room temperature. The side of the photoresist-forming layer bearing the film support is then exposed to ultraviolet light in an image pattern through the support, and the support is then removed. Alternatively, the support may be removed prior to exposure. The unexposed areas are then removed by washing them away with a solvent which removes only the unexposed, unpolymerized areas and not the exposed, polymerized areas. Electrical components are then added to the board with their wire leads bent over the appropriate circuit lines in the areas from which the areas of resist have been removed.

The side of the board having the circuit lines is then coated with flux and wave soldered at 3.5 feet per minute with a commercial wave soldering machine with a preheat station at 150° C. The solder used is a eutectic mixture of 63% tin and 37% lead. The solder pot also contains about 1–5% oil at 232°–260° C. After application of the solder, the board is cooled and degreased in a solvent such as 1,1,1-trichloroethane. The photoresist may then be removed by brushing with a suitable solvent, or it can be left in place. By this procedure, solder connections may be made in desired areas of the board while the other areas remain protected by the photoresist.

EXAMPLE 4

This example illustrates the formation of a resist image on a circuit board having closely spaced circuit lines by vacuum lamination. A photoresist-forming layer having a thickness of 0.004 inch and having an adherent polyester film support with a thickness of 0.01 inch is applied to an expoxy-fiberglass circuit board having raised copper circuit lines, which have a rectilinear cross section, are spaced 0.0034 inch apart, and have a height of 0.003 inch. The photoresist-forming layer is a negative-working layer comprised of a polymethylmethacrylate binder, pentaerythritoltriacrylate monomer, and tert-butylanthraquinone polymerization initiator.

The photoresist-forming layer with adherent support at room temperature, is applied to the surface of the circuit board, which is heated to 50° C., as described in Example 1. The layer conforms to and covers the circuit lines and forms a firm bond with the surface of the board without entrapped air bubbles. The layer is then exposed to ultraviolet radiation in an image pattern, the support is stripped off, and the unexposed areas of the layer are washed away with a solvent to leave a protective resist image on the circuit board.

EXAMPLE 5

This example illustrates the application of a photoresist-forming layer in a device using a resilient member to apply pressure to the layer through the film support and the use of the resist image for plating in the preparation of gold-tab connectors on circuit boards.

A circuit board having tab areas with raised circuit components of copper plated with tin-lead solder is heated to 100° C. and placed in a device having two opposing chambers, on an aluminum plate supported by a rubber diaphragm. A photoresist-forming layer with adherent film support of the type described in Example 1 is held against a resilient rubber backing sheet in the upper chamber adjacent to and apart from the circuit board while the device is closed by bringing the two chambers together and while both chambers are evacuated to less than 0.1 atmosphere. The lower chamber is then vented to the atmosphere, and the rubber diaphragm forces the aluminum plate and circuit board upward so that the circuit board is pushed into intimate contact with the photoresist-forming layer. The resilient rubber backing sheet provides an opposing force on the film support.

The layer thus applied is then exposed to ultraviolet light through a transparency that masks the tab areas. The unexposed photopolymerizable material is removed by a solvent wash as in Example 2. The solder is then removed from the tab areas by immersing the boards in a conventional solder etching bath. The board is then washed. The exposed copper components are then electroplated, first with nickel and then with gold. The resist is then removed from the board with a solvent, such as a mixture of methanol and methylene chloride, to give a circuit board with gold plated components on the tabs. The circuit board is then laminated with another photoresist-forming layer to be used as a soldermask and processed as in Example 3 to give a completed circuit board with soldered electrical components.

What is claimed is:

1. A process for applying a photoresist-forming layer on a surface having raised areas such as a circuit board having circuit lines, comprising (a) positioning one surface of a solid unexposed photoresist-forming layer adjacent to said surface having raised areas, while the other surface of said layer has adhered thereto with moderate-to-low adhesion, a thin, flexible, polymeric film support, said layer being weaker than said support,
   (b) reducing the absolute gas pressure to less than one tenth atmosphere on the side of said layer adjacent to said surface having raised areas and on the side of said layer to which said film support is adhered,
   (c) heating said layer to soften it,
   (d) thereafter, while maintaining the reduced pressure on the side of said layer adjacent to said surface having raised areas, pressing the photoresist-forming layer into intimate contact with the surface having raised areas, with said film support acting as the pressure-transmitting member to force the layer into conformation with the raised areas of the surface, and, in either order of steps (e) and (f),
   (e) exposing the photoresist-forming layer, imagewise, to actinic radiation,
   (f) stripping said film support from said layer, and
   (g) developing the layer to form an image.

2. A process according to claim 1 wherein a flexible web is positioned adjacent the other surface of said article.

3. A process according to claim 2 wherein said web comprises a photoresist-forming layer.

4. A process according to claim 2 wherein said photoresist-forming layer and said web extend beyond the periphery of said one article surface and form a package around said article when the photoresist-forming layer is forced into intimate contact with said one article surface.

5. The process of claim 1 wherein said surface having raised areas is also heated along with the heating of said layer.

6. The process of claim 1 wherein the height of said raised areas is greater than the thickness of said layer.

7. The process of claim 1 wherein said raised areas are comprised of metal and have a rectilinear cross section and height in the range of about 0.0003 inch to about 0.01 inch.

8. The process of claim 1 wherein said pressure is applied uniformly and simultaneously over the entire area of said layer.

9. The process of claim 8 wherein said pressure is gas pressure.

10. The process of claim 1 wherein said pressure is obtained by a roll advancing across the said film support.

11. The process of claim 1 wherein the development step is carried out by removing areas of the photoresist-forming layer imagewise to form a resist image on said surface having raised areas.

12. The process of claim 11 and additionally, permanently modifying the areas on said surface having raised areas which are unprotected by said resist image by etching said areas or depositing metal on said areas.

13. A process according to claim 12 wherein permanently modifying comprises depositing molten solder on said areas.